(12) United States Patent
Ni et al.

(10) Patent No.: US 8,643,436 B2
(45) Date of Patent: Feb. 4, 2014

(54) MULTI-LEVEL BOOSTED CLASS D AMPLIFIER

(75) Inventors: Jinhua Ni, Shanghai (CN); Dan Li, Shanghai (CN)

(73) Assignee: Analog Devices, Inc., Norwood, MA (US)

( * ) Notice: Subject to any disclaimer, the term of this patent is extended or adjusted under 35 U.S.C. 154(b) by 18 days.

(21) Appl. No.: 13/301,922

(22) Filed: Nov. 22, 2011

(65) Prior Publication Data

US 2013/0127530 A1    May 23, 2013

(51) Int. Cl.
*H03F 3/217*    (2006.01)
(52) U.S. Cl.
USPC .............................. 330/251; 330/207 A
(58) Field of Classification Search
USPC ..................................... 330/10, 207 A, 251
See application file for complete search history.

(56) References Cited

U.S. PATENT DOCUMENTS

| 6,118,932 A | 9/2000 | Maurio et al. | |
|---|---|---|---|
| 6,744,311 B2* | 6/2004 | Kirn | 330/251 |
| 7,330,069 B2* | 2/2008 | Yamamura et al. | 330/207 A |
| 8,076,971 B2* | 12/2011 | Kirn | 330/251 |
| 2006/0001332 A1 | 1/2006 | Ollila | |
| 2008/0042745 A1 | 2/2008 | Kozak et al. | |
| 2009/0153242 A1 | 6/2009 | Cygan et al. | |
| 2010/0045377 A1 | 2/2010 | Witchard | |
| 2010/0079206 A1 | 4/2010 | Song et al. | |
| 2011/0133836 A1 | 6/2011 | Yu et al. | |
| 2011/0235831 A1 | 9/2011 | Kaiho et al. | |

OTHER PUBLICATIONS

International Search Report and Written Opinion of the International Searching Authority in counterpart International Application No. PCT/US2012/066371, report dated Mar. 27, 2013.

* cited by examiner

*Primary Examiner* — Khanh V Nguyen
(74) *Attorney, Agent, or Firm* — Kenyon & Kenyon LLP

(57) ABSTRACT

Techniques to generate boosted multi-level switched output voltages from a boosted multi-level Class D amplifier. The amplifier may include a multi-level H-bridge, which may include pairs of transistor switches coupled to a first, second, and third supply potential. The second supply potential may be a boosted representation of the first supply potential. The amplifier may receive an input signal, and from the input signal may generate pulse-modulated control signals to control the switching for the transistor switches of the multi-level H-bridge. The amplifier may generate the boosted multi-level switched output voltages from output nodes of the multi-level H-bridge.

26 Claims, 6 Drawing Sheets

200

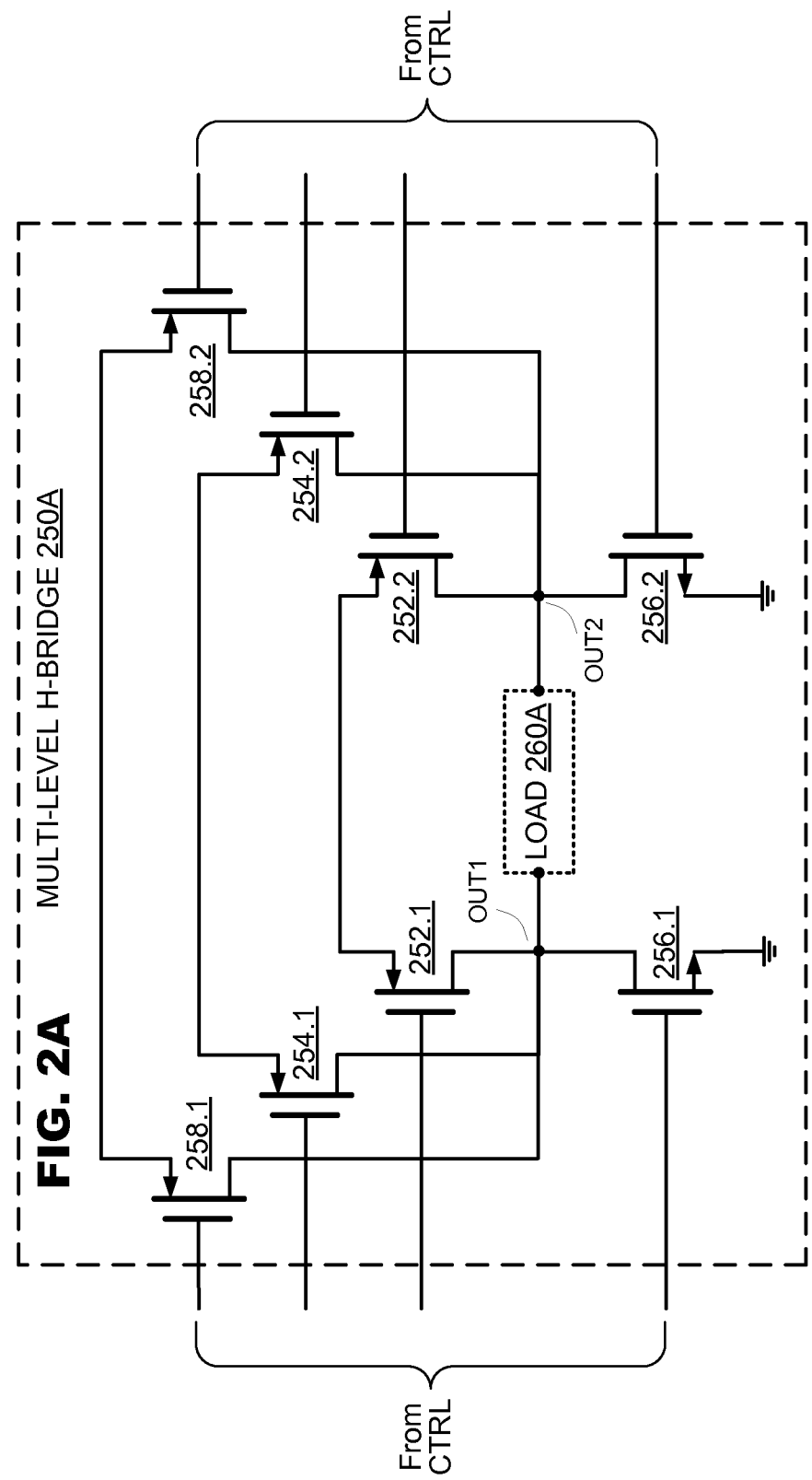

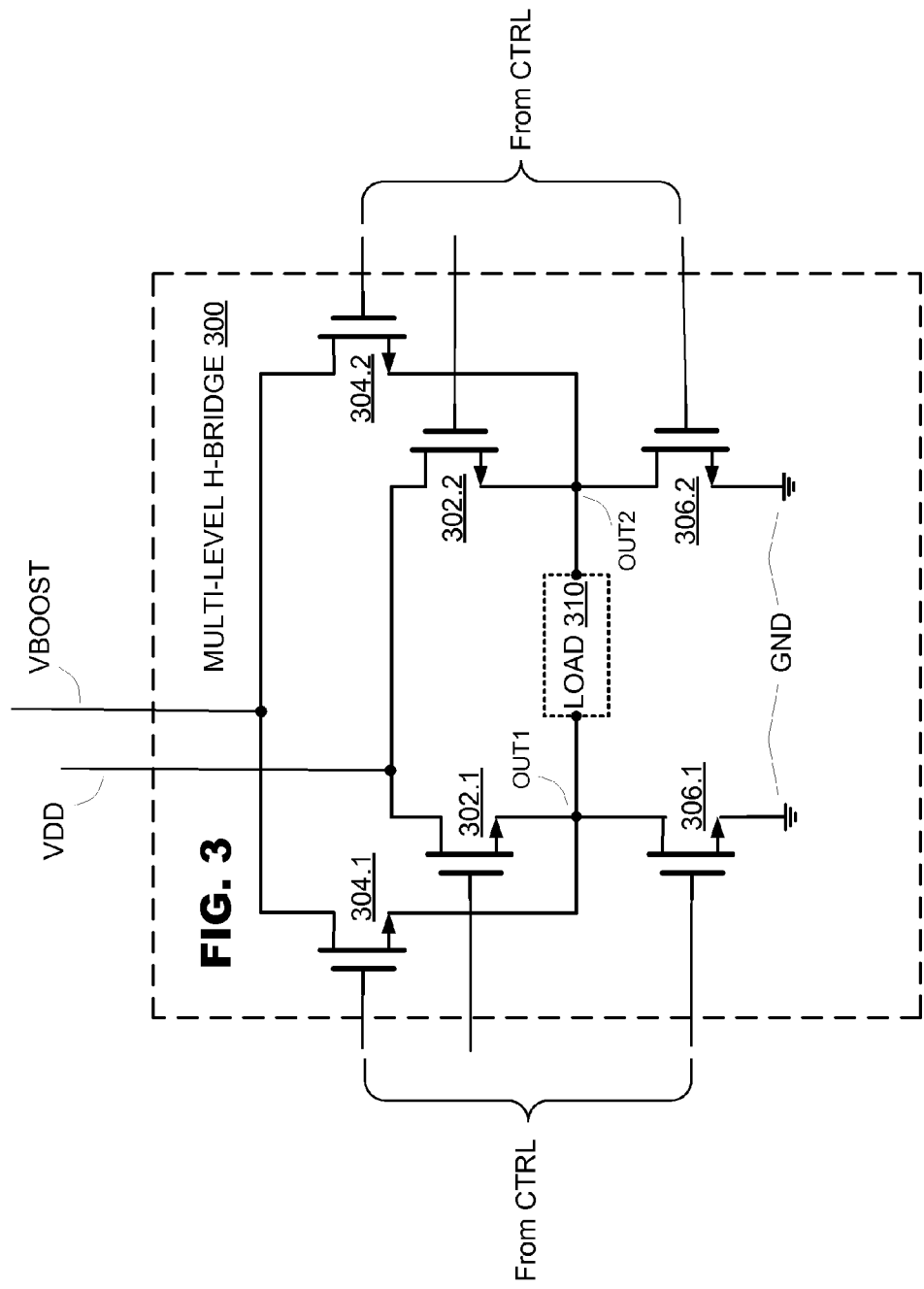

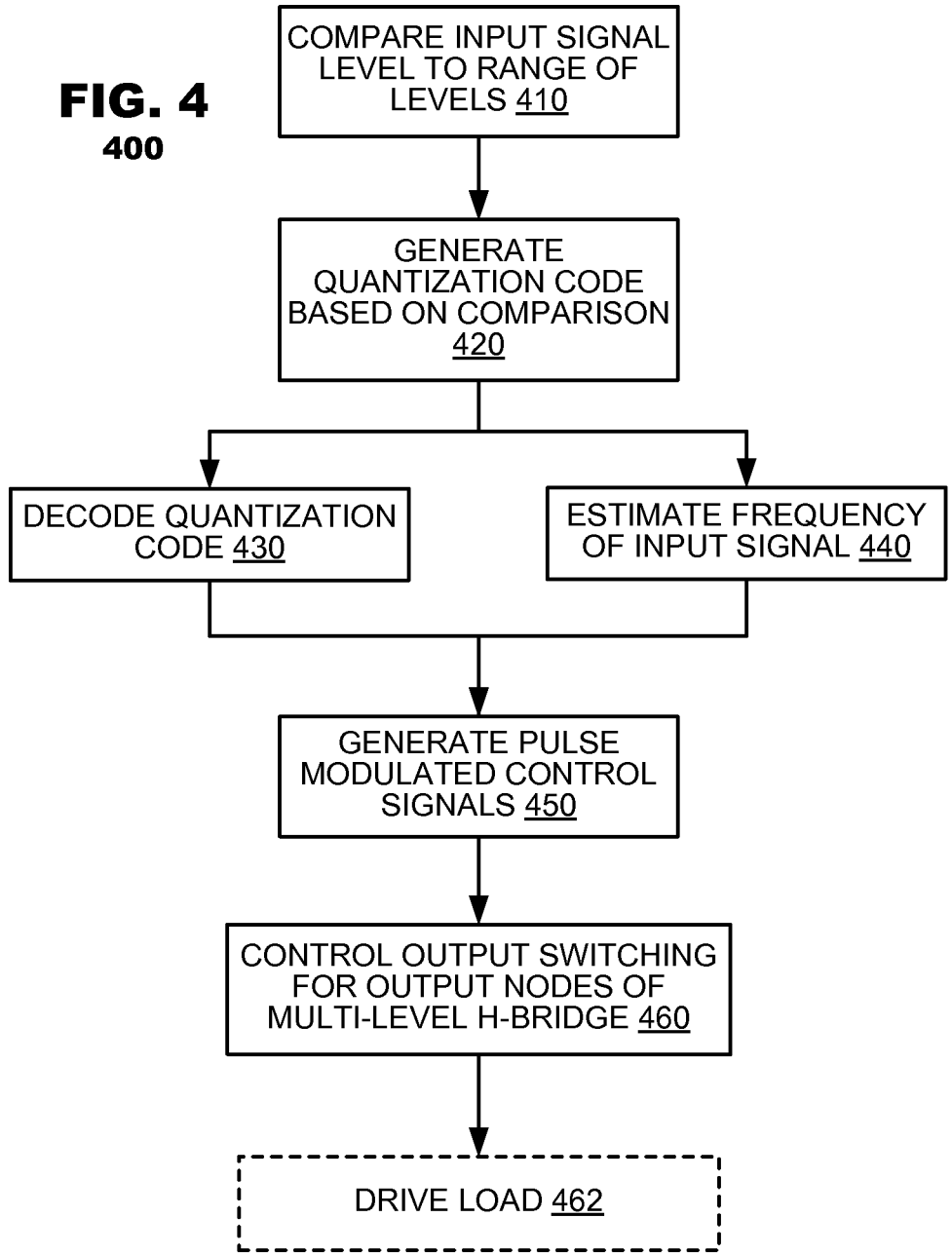

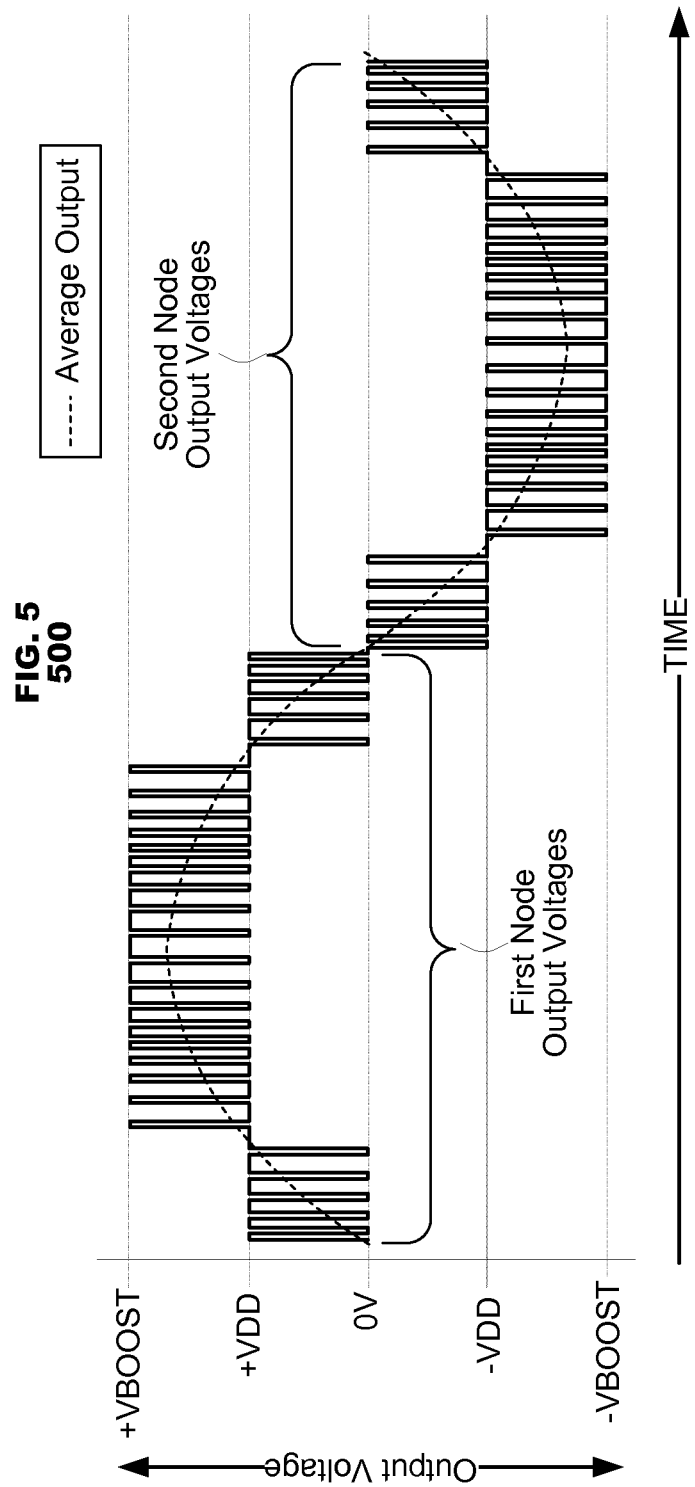

MULTI-LEVEL BOOSTED CLASS D AMPLIFIER

BACKGROUND

Class D amplifiers generate output voltages that may vary different output voltage levels. In particular, Class D amplifiers generate pulse modulated output voltages to drive load devices in response to amplitude variations of an input signal. Conventional Class D amplifiers are often implemented using a transistor H-bridge to generate switched output voltage levels.

FIG. 1 illustrates a conventional transistor H-bridge 100 that may be used in a Class D amplifier. A conventional transistor H-bridge 100 includes a pair of PMOS transistors MP1 and MP2 and a pair of NMOS transistors MN1 and MN2. The PMOS transistors MP1 and MP2 each have sources coupled to a first supply potential, illustrated here as VDD. The NMOS transistors MN1 and MN2 each have sources coupled to a second supply potential, illustrated here as GND. Transistors MP1 and MN1 are drain coupled at a first output node OUT1, and transistors MP2 and MN2 are drain coupled at a second output node OUT2. The transistor H-bridge may be coupled to a load 110 at the respective drain connections for MP1/MN1 and MP2/MN2. An H-bridge controller (not shown) may be coupled to the gates of each transistor and control switching of the transistors to output three voltage levels across the load 110. In certain audio applications, the load 110 may be an audio speaker. As a signal input to the class D amplifier changes in amplitude, the controller turns off and on the switches of the H-bridge to generate corresponding switched output voltage levels across the load. The three output voltage levels include +VDD, −VDD, and 0V.

During operation, transistor MP2 is switched on while transistor MN1 is held on to drive the +VDD voltage level across the load 110. To drive the −VDD voltage level across the load 110, transistor MP1 is switched on while transistor MN2 is held on. To drive 0V across the load 100, either MP1 and MP2 are switched on or MN1 and MN2 are switched on.

Class D amplifiers using conventional transistor H-bridges generally operate at approximately 90% efficiency. This efficiency level may be too low for portable applications such as consumer electronics devices because it negatively impacts battery life of the portable devices.

Voltage boosters may be used in Class D amplifiers to increase amplifier output power. A voltage booster boosts the VDD supply voltage coupled to transistors MP1 and MP2 in order to drive a voltage higher than the supply voltage VDD across the load 110. However, such boosters also operate at approximately 90% efficiency. The overall efficiency of a boosted Class D amplifier may therefore be decreased to an efficiency of approximately 81%, thus further decreasing battery life.

Accordingly, there is a need in the art for a voltage boosted Class D amplifier having increased operating efficiency.

BRIEF DESCRIPTION OF THE DRAWINGS

FIG. 2A illustrates a multi-level H-bridge according to an embodiment of the present invention.

FIG. 3 illustrates another multi-level H-bridge according to an embodiment of the present invention.

FIG. 4 illustrates a method for generating switched multi-level H-bridge output voltages from an input signal according to an embodiment of the present invention.

FIG. 5 illustrates a simulated output voltage pattern generated from a multi-level boosted Class D amplifier according to an embodiment of the present invention.

DETAILED DESCRIPTION

Embodiments of the present invention provide techniques to generate boosted multi-level switched output voltages from a boosted multi-level Class D amplifier. The amplifier may include a multi-level H-bridge, which may include pairs of transistor switches coupled to a first, second, and third supply potential. The second supply potential may be an amplitude boosted representation of the first supply potential. The amplifier may receive an input signal, and from the input signal may generate pulse-modulated control signals to control the switching for the transistor switches of the multi-level H-bridge. The amplifier may generate the boosted multi-level output voltages from the output nodes of the multi-level H-bridge.

Figure 2:
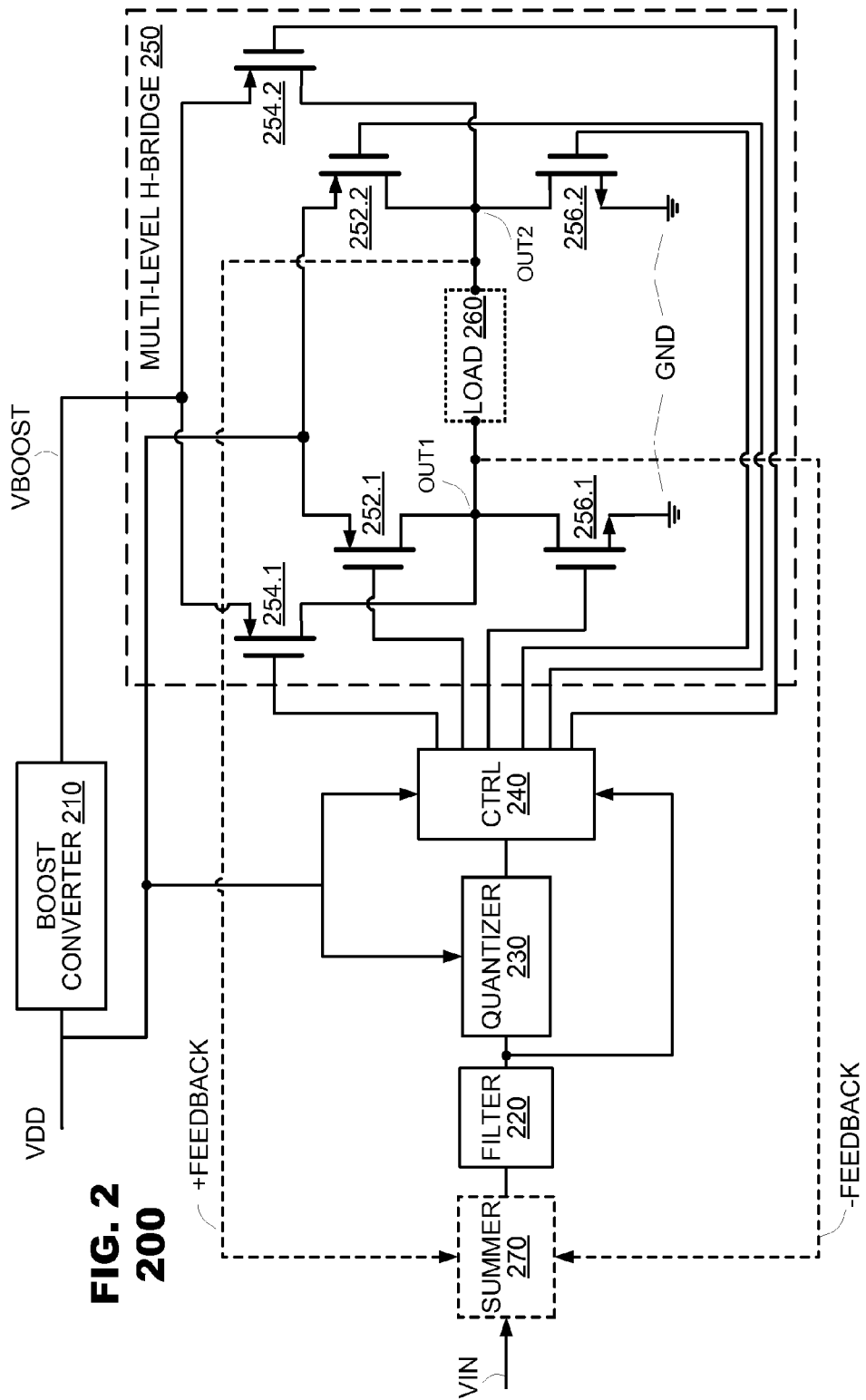
FIG. 2 illustrates a multi-level boosted Class D amplifier according to an embodiment of the present invention.

FIG. 2 illustrates a multi-level boosted Class D amplifier 200 according to an embodiment of the present invention. As illustrated in FIG. 2, the amplifier 200 may include a boost converter 210, a filter 220, a quantizer 230, a controller 240, and a multi-level H-bridge 250. The multi-level H-bridge 250 may include two pairs of transistor switches 252.1, 252.2, 254.1, 254.2; each pair may constitute upper "halves" of the H-bridge 250, and a another pair of transistor switches 256.1, 256.2 may constitute a lower "half" of the H-bridge 250.

Transistor switches 252.1, 252.2 may each receive a first supply potential, which is shown as VDD. Transistor switches 254.1, 254.2 may each receive a second supply potential, which is shown as VBOOST. Transistor switches 256.1, 256.2 may each receive a third supply potential, which is shown as GND. Transistor switches 252.1, 254.1, and 256.1 may have outputs coupled to each other at a first output node OUT1. Transistor switches 252.2, 254.2, and 256.2 may have outputs coupled to each other at a second output node OUT2. The multi-level H-bridge 250 may drive a load, device 260, which may be connected between the first and second output nodes OUT1 and OUT2. Each transistor of the multi-level H-bridge 250 may have a control input coupled to the controller 240.

The boost converter 210 may receive the first supply potential VDD and output the second supply potential VBOOST. The second supply potential typically may be an amplitude boosted representation of the first supply potential VDD. The quantizer 230 and controller 240 may each receive the first supply potential VDD, which may provide a reference voltage for their operation as discussed below.

The filter 220 may receive an input voltage signal VIN. The input signal VIN may vary in a differential manner in relation to a common mode operating voltage for the amplifier 200. The filter may include a low pass or bandpass filter and may remove unwanted electromagnetic interference ("EMI") or high frequency noise from the input voltage signal VIN. The filter 220 may output a filtered signal to the quantizer 230, which may quantize the voltage level of the signal as it relates to a predetermined range of voltage levels. The controller 240 may also receive the filtered output signal.

Based on the first supply potential VDD, the quantizer 230 may determine a range of reference voltages, which may relate to the common mode operating voltage for the amplifier 200, the magnitude of the first supply potential VDD, and the number of output voltage levels that the amplifier 200 may drive across the load 260. For example, say common mode operating voltage may be at 2.5V, the magnitude of the first supply potential VDD may range from 0V-5V, and the amplifier may generate five output voltage levels across the load 260. The quantizer 230 may set four reference voltage levels from 0V to 5V (i.e., 1V, 2V, 3V, etc.) and compare the filtered output signal to the levels. Based on the comparison, the quantizer 230 may output a code to the controller 240 to indicate the corresponding voltage level of the filtered signal.

As discussed, the controller 240 may also receive the first supply voltage VDD and the filtered output signal. The controller may estimate the frequency of the filtered output signal using zero-crossing estimations (as related to the common mode voltage) or a similar frequency estimation method. Using the code from the quantizer 230 and the frequency estimation, the controller 240 may generate pulse modulated control signals to control the H-bridge 250 transistor switching. The transistor switching may generate multi-level switched output voltages across the load 260, which may vary from −VBOOST to +VBOOST and include voltage levels: −VBOOST, −VDD, 0V (ground or the common mode voltage), +VDD, and +VBOOST. The controller 240 may determine sign changes of the switched output voltages as they relate to the frequency of the input signal VIN as it may fluctuate about the common mode voltage. The controller 240 may modulate the output voltage switching according to pulse-density modulation ("PDM"), pulse-width modulation ("PWM"), and the like.

For example, to drive switched output voltages across the load 260 between +VDD and +VBOOST, transistor switches 254.1 and 252.1 may be switched off and on in an opposing manner while transistor switch 256.2 may be held on. To drive switched output voltages across the load 260 between +VDD and 0V, transistor switches 252.1 and 256.1 may be switched off and on in an opposing manner while transistor switch 256.2 may be held on. To drive switched output voltages across the load between 0V and −VDD, transistor switches 252.2 and 256.2 may be switched off and on in an opposing manner while transistor switch 256.1 may be held on. To drive switched output voltages across the load between −VDD and −VBOOST, transistor switches 254.2 and 252.2 may be switched off and on in an opposing manner while transistor 256.1 may be held on. The pulse-width and/or pulse-density of the on/off times of the respective switches may determine the magnitude of the average switched output voltage for each of the voltage ranges. The on/off times may also relate to the frequency of the input voltage VIN as it varies about the common mode voltage for the amplifier 200.

Figure 1:
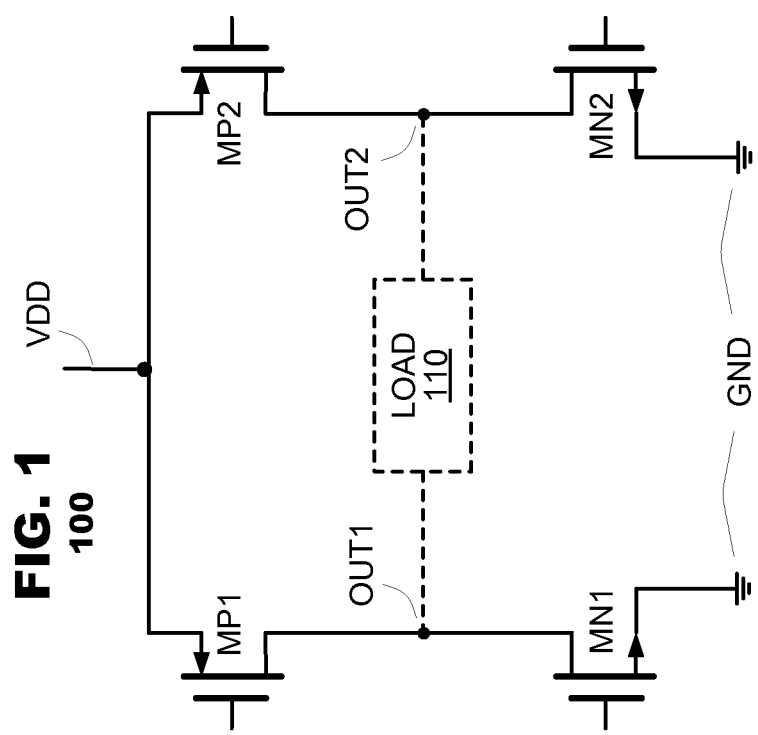
FIG. 1 illustrates a conventional transistor H-bridge that may be used in a Class D amplifier.

The addition of the transistor switch pair 254.1 and 254.2 to the multi-level H-bridge 250 configuration may increase the overall efficiency of the amplifier 200. Recall the conventional H-bridge 100 of FIG. 1, which could only receive one supply potential. When configured in a boosted amplifier configuration as illustrated in FIG. 2, only the second supply potential VBOOST may feed the conventional H-bridge 100. Operationally, the conventional H-bridge 100 requires the boost converter 210 to operate at all times—even at times when the voltage across the load 260 need only be driven to voltages between +/−VDD. This inefficiency may be overcome, however, with the multi-level H-bridge 250 which may receive both the first supply potential VDD coupled to the sources of transistors 252.1, 252.2 and the second supply potential VBOOST coupled to the sources of transistors 254.1, 254.2. For the amplifier 200 configured with the multi-level H-bridge 250, current may be drawn from the boost converter 210 for periods when the voltage being driven across the load 260 may be greater in magnitude than VDD.

In an embodiment, feedback signals +FEEDBACK, −FEEDBACK may be coupled between respective output nodes OUT1 and OUT2 and a summer 270 to form a negative feedback loop within the amplifier 200. The summer 270 may combine each feedback signal +FEEDBACK, −FEEDBACK with the input voltage signal VIN. The negative feedback loop may operate to increase the accuracy and/or stability of the amplifier output to track changes in the input signal VIN. The feedback loop may also operate to increase the gain of the amplifier 200.

In an embodiment, the upper half pairs of transistors switches 252.1, 252.2, 254.1, 254.2 may be configured as PMOS transistor switches and the lower half pair of transistor switches 256.1, 256.2 may be configured as NMOS transistor switches. In another embodiment, the upper half pairs of transistor switches 252.1, 252.2, 254.1, 254.2 may be configured as NMOS transistor switches and the lower half pair of transistor switches 256.1, 256.2 may be configured as NMOS transistor switches. FIG. 3, below, describes such an embodiment. In another embodiment, the upper half pairs of transistor switches 252.1, 252.2, 254.1, 254.2 may be configured as P-type field effect transistors ("FETs") and the lower half pair of transistor switches 256.1, 256.2 may be configured as N-type FETs. In another embodiment, the upper half pairs of transistor switches 252.1, 252.2, 254.1, 254.2 may be configured as N-type FETs and the lower pair of transistor switches 256.1, 256.2 may be configured as N-type FETs.

In various embodiments, as illustrated in FIG. 2A, a multi-level H-bridge 250A may be configured with additional pairs of upper half transistor switches (illustrated here as 258.1 and 258.2) to accommodate more voltage levels that may be driven across a load 260A. Increasing the number of transistor pairs may allow for increased voltage control (the application of more precise output voltage magnitudes) across the load 260A.

FIG. 3 illustrates another multi-level H-bridge 300 according to an embodiment of the present invention. As illustrated in FIG. 3, the multi-level H-bridge 300 may include two pairs of NMOS transistor switches 302.1, 302.2, 304.1, and 304.2; each pair constituting upper "halves" of the H-bridge 300, and pair of NMOS transistor switches 306.1, 306.2 constituting a lower "half" of the H-bridge 300. Each transistor switch may have a control input coupled to a controller (e.g., controller 240 of FIG. 2).

The NMOS transistor switches 302.1, 302.2 may each have drains coupled to a first supply potential, which is shown as VDD. The NMOS transistor switches 304.1, 304.2 may each have drains coupled to a second supply potential, which is shown as VBOOST. The NMOS transistor switches 306.1, 306.2 may each have sources coupled to a third supply potential, which is shown as GND. Transistor switches 302.1 and 304.1 may be source coupled to each other at a first output node OUT1. Transistor switch 306.1 may be drain coupled to the first output node OUT1. Transistor switches 302.2 and 304.2 may be source coupled to each other at a second output node OUT2. Transistor switch 306.2 may be drain coupled to the second output node OUT2. The multi-level H-bridge 300 may drive a load, device 360, which may be connected between the first and second output nodes OUT1 and OUT2.

When configured within an amplifier 200 as illustrated in FIG. 2, the multi-level H-bridge 300 may be controlled to drive switched output voltage levels across the load 310 that may vary in a differential manner from −VBOOST to +VBOOST and include a range of voltage levels: −VBOOST, −VDD, 0V (GND), +VDD, and +VBOOST.

FIG. 4 illustrates a method 400 for generating switched multi-level H-bridge output voltages from an input signal according to an embodiment of the present invention. As illustrated in block 410, the method 400 may compare an input signal level to a predetermined range of levels. The method may generate a quantization code based on the comparison (block 420). The method 400 may decode the quantization code (block 430) and estimate the frequency of the input signal (block 440). The method may generate pulse-modulated control signals from the decoded quantization and frequency estimation (block 450). The method 400 may control the output voltage switching for output nodes of the multi-level H-bridge according the pulse-modulated control signals (block 460).

In an embodiment, the method 400 may drive the multi-level switched output voltages across a load (block 462). For example, the boosted output voltage may be driven across an audio speaker that may be connected to the multi-level H-bridge.

FIG. 5 illustrates a simulated output voltage pattern 500 generated from a first and second output node of a multi-level boosted Class D amplifier according to an embodiment of the present invention. As illustrated in the simulated output voltage pattern of FIG. 5, a multi-level H-bridge (e.g., multi-level H-bridge 250 of FIG. 2) configured within a boosted class D amplifier may generate a switched output voltage that may vary across a +/− range of output voltages at each of the nodes. The output voltages may correspond to supply potentials coupled to the H-bridge. Here, the supply potentials are illustrated as VBOOST, VDD, and 0V (GND) and the range of output voltages may include +VBOOST, +VDD, GND, −VDD, and/or −VBOOST. FIG. 5 illustrates positive switched output voltages from the first node and negative switched output voltages from the second node. A controller (e.g., controller 240 of FIG. 2) may control switching of the multi-level H-bridge according to a pulse modulation switching scheme.

For example, say a desired amplifier output voltage may be greater than +VDD. The controller may control the transistor switching for the multi-level H-bridge between VDD and VBOOST to generate a corresponding switched output voltage pattern between +VDD and +VBOOST at the first output node. An average output voltage may be derived from the switched output voltages of both output nodes, which is also shown in FIG. 5.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A multi-level class D amplifier, comprising:
a hybrid H-bridge circuit, having a pair of output terminals, comprising:
a first pair of transistors, each connecting one of the output terminals to a first supply voltage that, when activated, pulls the respective output terminal in a first voltage direction,
a second pair of transistors, each connecting one of the output terminals to a second supply voltage different from the first supply voltage that, when activated, pulls the respective output terminal in the first voltage direction,
a third pair of transistors, each connecting one of the output terminals to a third supply voltage different from the first and second supply voltages, that, when activated, pulls the respective output terminal in a second voltage direction different from the first voltage direction,
a quantizer to compare an input signal to a plurality of threshold voltages, and
a controller, coupled to the quantizer, to generate a pulse density modulated (PDM) control signal to the H bridge circuit, the control signal activating, during at least one operational phase of the PDM signal, one of the first and second pairs of transistors connected to one of the output terminals and one of the third pair of transistors connected to an other one of the output terminals,
wherein an output voltage between the pair of output terminals comprises a plurality of pulses,
wherein a maximum voltage and a minimum voltage of each of the plurality of pulses are two adjacent voltage levels of more than three distinct voltage levels, and
the plurality of pulses has more than two distinct combination of the maximum voltage and the minimum voltage as two adjacent voltage levels of more than three distinct voltage levels.

2. The amplifier of claim 1, wherein the first voltage direction is a pull up direction and the second voltage direction is a pull down direction.

3. The amplifier of claim 1, wherein the first voltage direction is a pull down direction and the second voltage direction is a pull up direction.

4. The amplifier of claim 1, wherein:
the first supply voltage is boosted in magnitude with respect to the second supply voltage and at least two threshold voltages are related to the second supply voltage.

5. The amplifier of claim 1, wherein the first and second pair of transistors are PMOS transistors and the third pair of transistors are NMOS transistors.

6. The amplifier of claim 1, wherein the first and second pair of transistors are NMOS transistors and the third pair of transistors are NMOS transistors.

7. A multi-level boosted class D amplifier, comprising:
a boost converter having an input for a first supply potential and an output for a second supply potential;
a filter receiving an input signal;
a quantizer having inputs coupled to the first supply potential, and an output signal from the filter;
a controller having inputs coupled to the first supply potential, an output signal of the quantizer, and the output signal from the filter;
a multi-level H-bridge, comprising pairs of upper half transistor switches, a first pair receiving the first supply potential, a second pair receiving the second supply potential, a pair of lower half transistor switches receiving a third supply potential, a first transistor of the upper and lower half transistor switch pairs each being coupled to a first output node, a second transistor of the upper and lower half transistor switch pairs each being coupled to a second output node; and wherein each of the transistor switches having a control input coupled to an output signal from the controller.

8. The amplifier of claim 7, further comprising:
a summer having inputs for the input signal, and a pair of feedback signals being coupled to the multi-level H-bridge first and second output node; and
the filter receiving an output signal from the summer.

9. The amplifier of claim 7, wherein the second supply potential is greater than the first supply potential.

10. The amplifier of claim 7, wherein the quantizer further comprises a plurality of comparators.

11. The amplifier of claim 7, wherein the controller controls the switching of the transistor switches according to pulse-density modulation.

12. The amplifier of claim 7, wherein the controller controls the switching of the transistor switches according to pulse-width modulation.

13. The amplifier of claim 7, wherein the pairs of upper half transistor switches are PMOS transistors switches, the first pair of PMOS transistor switches being source coupled to the first supply potential, the second pair of PMOS transistor switches being source coupled to the second supply potential, and the lower half transistor switches are NMOS transistor switches being source coupled to the third supply potential;
wherein the first PMOS transistor switch of each of the pairs of upper half transistor switches and the first NMOS transistor switch of the lower half transistor switch pair are drain coupled to the first output node; and
wherein the second PMOS transistor switch of each of the pairs of upper half transistor switches and the second NMOS transistor switch of the lower half transistor switch pair are each drain coupled to the second output node.

14. The amplifier of claim 7, wherein the pairs of upper half transistor switches are NMOS transistors switches, the first pair of NMOS transistor switches being drain coupled to the first supply potential, the second pair of NMOS transistor switches being drain coupled to the second supply potential, and the lower half transistor switches are NMOS transistor switches being source coupled to the third supply potential;
wherein the first NMOS transistor switch of each of the pairs of upper half transistor switches are source coupled to the first output node and the first NMOS transistor switch of the lower half transistor switch pair is drain coupled to the first output node; and
wherein the second NMOS transistor switch of each of the pairs of upper half transistor switches are source coupled to the first output node and the second NMOS transistor switch of the lower half transistor switch pair is drain coupled to the first output node.

15. The amplifier of claim 7, wherein the pairs of upper half transistor switches are P-type field effect transistor ("FET") switches, the first pair of P-type FET switches being source coupled to the first supply potential, the second pair of P-type FET switches being source coupled to the second supply potential, and the lower half transistor switches are N-type FET switches being source coupled to the third supply potential;
wherein the first P-type FET switch of each of the pairs of upper half transistor switches and the first N-type FET switch of the lower half switch pair are drain coupled to the first output node; and
wherein the second P-type FET switch of each of the pairs of upper half transistor switches and the second N-type FET switch of the lower half transistor switch pair are each drain coupled to the second output node.

16. The amplifier of claim 7, wherein the pairs of upper half transistor switches are N-type field effect transistor ("FET") switches, the first pair of N-type FET switches being drain coupled to the first supply potential, the second pair of N-type FET switches being drain coupled to the second supply potential, and the lower half transistor switches are N-type FET switches being drain coupled to the third supply potential;
wherein the first N-type FET switch of each of the pairs of upper half transistor switches are source coupled to the first output node and the first N-type FET switch of the lower half switch pair is drain coupled to the first output node; and
wherein the second N-type FET switch of each of the pairs of upper half transistor switches are source coupled to the first output node and the second N-type FET switch of the lower half transistor switch pair is drain coupled to the second output node.

17. A multi-level H-bridge comprising:
pairs of upper half transistor switches, a first pair receiving a first supply potential, a second pair receiving a second supply potential, a pair of lower half transistor switches receiving a third supply potential, a first transistor of the upper and lower half transistor switch pairs each being coupled to a first output node, a second transistor of the upper and lower half transistor switch pairs each being coupled to a second output node,
wherein an output voltage between the first output node and the second output node comprises a plurality of pulses,
wherein a maximum voltage and a minimum voltage of each of the plurality of the pulses are two adjacent voltage levels of more than three distinct voltage levels, and
the plurality of the pulses has more than two distinct combination of the maximum voltage and the minimum voltage as two adjacent voltage levels of more than three distinct voltage levels.

18. The multi-level H-bridge of claim 17, wherein each transistor having a control input coupled to a control signal.

19. The multi-level H-bridge of claim 17, wherein the pairs of upper half transistor switches are PMOS transistors switches, the first pair of PMOS transistor switches being source coupled to the first supply potential, the second pair of PMOS transistor switches being source coupled to the second supply potential, and the lower half transistor switches are NMOS transistor switches being source coupled to the third supply potential;
wherein the first PMOS transistor switch of each of the pairs of upper half transistor switches and the first transistor switch of the NMOS transistor switch pair are drain coupled to the first output node; and
wherein the second PMOS transistor switch of each of the pairs of upper half transistor switches and the second transistor switch of the NMOS transistor switch pair are each drain coupled to the second output node.

20. The multi-level H-bridge of claim 17, wherein the pairs of upper half transistor switches are NMOS transistors switches, the first pair of NMOS transistor switches being drain coupled to the first supply potential, the second pair of NMOS transistor switches being drain coupled to the second supply potential, and the lower half transistor switches are NMOS transistor switches being source coupled to the third supply potential;
wherein the first NMOS transistor switch of each of the pairs of upper half transistor switches are source coupled to the first output node and the first transistor switch of the lower half NMOS transistor switch pair is drain coupled to the first output node; and wherein the second NMOS transistor switch of each of the pairs of upper half transistor switches and the second transistor switch of the lower half NMOS transistor switch pair is drain coupled to the second output node.

21. The multi-level H-bridge of claim 17, wherein the pairs of upper half transistor switches are P-type field effect transistor ("FET") switches, the first pair of P-type FET switches being source coupled to the first supply potential, the second pair of P-type FET switches being source coupled to the second supply potential, and the lower half transistor switches are N-type FET switches being source coupled to the third supply potential;

wherein the first P-type FET switch of each of the pairs of upper half transistor switches and the first N-type FET switch of the lower half switch pair are drain coupled to the first output node; and wherein the second P-type FET switch of each of the pairs of upper half transistor switches and the second N-type FET switch of the lower half transistor switch pair are each drain coupled to the second output node.

22. The multi-level H-bridge of claim 17, wherein the pairs of upper half transistor switches are N-type field effect transistor ("FET") switches, the first pair of N-type FET switches being drain coupled to the first supply potential, the second pair of N-type FET switches being drain coupled to the second supply potential, and the lower half transistor switches are N-type FET switches being source coupled to the third supply potential;

wherein the first N-type FET switch of each of the pairs of upper half transistor switches are source coupled to the first output node and the first N-type FET switch of the lower half switch pair is drain coupled to the first output node; and wherein the second N-type FET switch of each of the pairs of upper half transistor switches are source coupled to the second output node and the second N-type FET switch of the lower half transistor switch pair is drain coupled to the second output node.

23. A method for generating switched multi-level H-bridge output voltages from an input signal, comprising:

comparing the input signal level to a predetermined range of levels;

generating a quantization code representing the input signal level based on the comparison;

decoding the quantization code and estimating the frequency of the input signal;

generating pulse-modulated control signals from the decoded quantization code and frequency estimation; and controlling the output voltage switching for output nodes of the multi-level H-bridge according to the pulse-modulated control signal to generate an output voltage between the output nodes comprising a plurality of pulses, wherein a maximum voltage and a minimum voltage of each of the plurality of the pulses are two adjacent voltage levels of more than three distinct voltage levels, and the plurality of the pulses has more than two distinct combination of the maximum voltage and the minimum voltage as two adjacent voltage levels of more than three distinct voltage levels.

24. The method of claim 23, wherein the multi-level H-bridge output voltages are switched between three supply potential voltages.

25. The method of claim 23, wherein the pulse-modulated control signals are pulse-density modulated control signals.

26. The method of claim 23, wherein the pulse-modulated control signals are pulse-width modulated control signals.

* * * * *